(12) United States Patent
Kelzenberg et al.

(10) Patent No.: US 8,808,933 B2
(45) Date of Patent: Aug. 19, 2014

(54) SEMICONDUCTOR WIRE ARRAY STRUCTURES, AND SOLAR CELLS AND PHOTODETECTORS BASED ON SUCH STRUCTURES

(75) Inventors: Michael D. Kelzenberg, Pasadena, CA (US); Harry A. Atwater, South Pasadena, CA (US); Ryan M. Briggs, Pasadena, CA (US); Shannon W. Boettcher, Eugene, OR (US); Nathan S. Lewis, La Canada, CA (US); Jan A. Petykiewicz, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 712 days.

(21) Appl. No.: 12/957,065

(22) Filed: Nov. 30, 2010

(65) Prior Publication Data

US 2011/0129714 A1    Jun. 2, 2011

Related U.S. Application Data

(60) Provisional application No. 61/265,306, filed on Nov. 30, 2009, provisional application No. 61/265,297, filed on Nov. 30, 2009, provisional application No. 61/313,654, filed on Mar. 12, 2010.

(51) Int. Cl.
| | |
|---|---|
| *H01M 6/30* | (2006.01) |
| *H01L 31/0232* | (2014.01) |
| *H01L 31/0236* | (2006.01) |
| *H01L 31/052* | (2014.01) |
| *H01L 31/0224* | (2006.01) |
| *H01L 31/0352* | (2006.01) |
| *H01L 31/18* | (2006.01) |
| *H01L 31/068* | (2012.01) |

(52) U.S. Cl.
CPC .... *H01L 31/035281* (2013.01); *H01L 31/0522* (2013.01); *Y02E 10/547* (2013.01); *H01L 31/0527* (2013.01); *H01L 31/022425* (2013.01); *Y02E 10/52* (2013.01); *H01L 31/1804* (2013.01); *H01L 31/068* (2013.01)
USPC ........... 429/411; 136/253; 136/256; 257/432; 257/E31.127; 257/E31.13

(58) Field of Classification Search
CPC ............... H01L 31/022425; H01L 31/035281; H01L 31/0522; H01L 31/0527; H01L 31/068; H01L 31/1804; Y02E 10/52; Y02E 10/547
USPC .............. 136/256; 257/432, E31.127, E31.13
See application file for complete search history.

(56) References Cited

U.S. PATENT DOCUMENTS

| | | | |
|---|---|---|---|
| 2006/0207647 A1* | 9/2006 | Tsakalakos et al. | 136/256 |
| 2007/0099008 A1* | 5/2007 | Shimizu et al. | 428/447 |

(Continued)

OTHER PUBLICATIONS

Ghebrebrhan et al., "Global optimization of silicon photovoltaic cell front coatings", Optics Express, Apr. 22, 2009.*

(Continued)

*Primary Examiner* — Matthew Martin
(74) *Attorney, Agent, or Firm* — Joseph R. Baker, Jr.; Gavrilovich, Dodd & Lindsey LLP

(57) ABSTRACT

A structure comprising an array of semiconductor structures, an infill material between the semiconductor materials, and one or more light-trapping elements is described. Photoconverters and photoelectrochemical devices based on such structure also described.

9 Claims, 12 Drawing Sheets

(56) References Cited

U.S. PATENT DOCUMENTS

| | | | |
|---|---|---|---|
| 2007/0157964 A1* | 7/2007 | Gronet | 136/251 |
| 2008/0006319 A1* | 1/2008 | Bettge et al. | 136/244 |
| 2008/0041439 A1* | 2/2008 | Achutharaman et al. | 136/244 |
| 2009/0078303 A1* | 3/2009 | Brezoczky et al. | 136/246 |
| 2009/0165849 A1* | 7/2009 | Chan et al. | 136/256 |
| 2010/0175748 A1* | 7/2010 | Karg | 136/256 |
| 2012/0031486 A1* | 2/2012 | Parce et al. | 136/256 |

OTHER PUBLICATIONS

Min et al., "Semiconductor Nanowires Surrounded by Cylindrical Al2O3 shells", Journal of Electronic Materials, 2003.*

Kayes et al., "Growth of vertically aligned Si wire arrays over large areas with Au and Cu catalysts".*

Altermatt, P., et al., Simulation of optical properties of Si wire cells, 34$^{th}$ IEEE Photovoltaic Specialists Conference 2009, 000972-000977.

Aspnes, D.E., Optical properties of c-Si: general aspects in Optical properties 1999, chapter 12, 677, 679-697.

Kayes, B., et al., Comparison of the device physics principles of planar and radial p-n junction nanorod solar cells, Journal of Applied Physics 2005, 97: 114302-1-114302-11.

Kayes, B. et al., Growth of vertically aligned Si wire arrays over large areas (>1cm2) with Au and Cu catalysts, Applied Physics Letters 2007, 91: 103110-1-103110-3.

Kelzenberg, M., et al., Predicted efficiency of Si wire array solar cells, 34$^{th}$ IEEE Photovoltaic Specialists Conference 2009, 001948-001953.

Marion, B., et al., Validation of a photovoltaic module energy ratings procedure at NREL, NREL Technical Report 1999, NREL/TP-520-26909 1-48.

Marion, B., et al., Validation of a photovoltaic module energy ratings procedure at NREL, NREL Technical Report 1999, NREL/TP-520-26909 49-97.

Tiedje, T., et al., Limiting efficiency of silicon solar cells, IEEE Transactions on Electron Devices 1984, ED-31: 711-716.

Yablonovitch, E., Statistical ray optics, Journal of the Optical Society of America 1982, 72: 899-907.

Yablonovitch, E., et al., Unusually low surface-recombination velocity on silicon and germanium surfaces, Physical Review Letters 1986, 57: 249-252.

Peng, K. et al. Aligned single-crystalline Si nanowire arrays for photovoltaic applications, Small 2005, 1: 1062-1067.

Sivakov, V. et al. Silicon nanowire-based solar cells on glass: Synthesis, optical properties, and cell parameters. Nano Lett. 2009, 9: 1549-1554.

Fan, Z. et al. Three-dimensional nanopillar-array photovoltaics on low-cost and flexible substrates. Nature Mater. 2009, 8: 648-653.

Boettcher, SW., et al., Energy-conversion properties of vapor-liquid-solid-grown silicon wire-array photocathodes, Science 2010, 327: 185-187.

Kempa, TJ, et al., Single and tandem axial p-i-n nanowire photovoltaic devices, Nano Letters 2008, 8: 3456-3460.

Garnett, EC., et al., Silicon nanowire radial p-n junction solar cells, JACS 2008, 130: 9224-9225.

Colombo, C., et al., Gallium arsenide p-i-n radial structures for photovoltaic applications, Applied Physics Letters 2009, 94: 173108-1-173108-3.

Dong, YJ., et al., Coaxial group III-Nitride nanowire photovoltaic, Nano Letters 2009, 9: 2183-2187.

Goto, H., et al., Molecular nanojet in water, Applied Physics Express 2009, 2: 035004-1-035004-2.

Balakrisnan, B., et al., Patterning PDMS using a combination of wet and dry etching, J. Micromech. Microeng. 2009, 19: 047002-1-047002-7.

Takayama, S., et al., Topographical Micropatterning of Poly(dimethylsiloxane) Using Laminar Flows of Liquids in Capillaries, Advanced Materials 2001, 13: 570-574.

Tsakalakos, L., et al., Silicon nanowire solar cells, Applied Physics Letters 2007, 91: 233117-1-233117-3.

Stelzner, T., et al., Silicon nanowire-based solar cells, Nanotechnology 2008, 19: 295203-1-295203-4.

Gunawan, O., et al., Characteristics of vapor-liquid-solid grown silicon nanowire solar cells, Sol. Energy Mater. Sol. Cells 2009, 93: 1388-1393.

Hu, L., et al., Analysis of optical absorption in silicon nanowire arrays for photovoltaic applications, Nano Letters 2007, 7: 3249-3252.

Muskens, OL, et al., Design of light scattering in nanowire materials for photovoltaic applications, Nano Letters 2008, 8: 2638-2642.

Zhu, J., et al., Optical absorption enhancement in amorphous silicon nanowire and nanocone arrays, Nano Letters 2009, 9: 279-282.

Tian, B., et al., Coaxial silicon naowires as solar cells and nanoelectronic power sources, Nature 2007, 449: 885-889.

Goodey, AP, et al., Silicon nanowire array photoelectrochemical cells, JACS 2007, 129: 12344-12345.

Mailo, J., et al., High aspect ratio silicon wire array photoelctrochemical cells, JACS 2007, 129: 12346-13247.

Plass, KE., et al., Flexible polymer-embedded Si wire array, Advanced Materials 2009, 21: 325-328.

Spurgeon, JM, et al., Repeated epixatel growth and transfer of arrays patterned, vertically aligned, crystalline Si wires from a single Si(111) substrate, Applied Physics Letters 2008, 93: 032112-1-032112-3.

Wagner, RS, et al., Vapor-liquid-solid mechanism of single growth, Applied Physics Letters 1964, 4: 89-90.

Putnam, MC, et al., 10 μm minority-carrier diffusion lengths in Si wires stnthesized by Cu-vapor-liquid-solid growth, Applied Physics Letters 2009, 95: 163116-1-163116-3.

Kelzenberg, MD, et al., Photovoltaic measurements in single-nanowire silicon solar cells, Nano Letters 2008, 8: 710-714.

Tsakalakos, L., et al., Strong broadband optical absorption in silicon nanowire films, Journal of Nanophotonics 2007, 1: 013552-1-013552-10.

Campbell, P., et al., The limiting efficiency of silicon solar cells under concentrated sunlight, IEEE Trans. Electron Devices 1986, 33: 234-239.

Kupec, J., et al., Dispersion, wave propagation and efficiency analysis of nanowire solar cells, Optical Express 2009, 17: 10399-10410.

Yoon, J., et al., Ultrathin silicon solar microcells for semitransparent, mechanically flexible and microconcentrator module designs, Nat. Mater. 2008, 7: 907-915.

Putnam, MC, et al., Secondary ion mass spectrometry of vapo-liquid-solid grown, Au-catalyzed, Si wires, Nano Letters 2008, 8: 3109-3113.

Forouhi, AR, et al., Optical dispersion relations for amorphous semiconductors and amorphous dielectrics, Physical Review B 1986, 34: 7018-7026.

Guttler, G. et al., Impurity photovoltaic effect in silicon, Energy Conversion 1970, 10: 51-55.

Wolf, M., Limitations and possibilities for improvement of photovoltaic solar energy converters: Part I: Considerations for Earth's surface operation, Proceedings of IRE 1960, 48: 1246-1263.

Shockley, et al., Detailed balance limit of efficiency of p-n junction solar cells, J. Appl. Physics 1961, 32: 510-519.

Keevers, MJ, et al., Efficiency improvements of silicon solar cells by the impurity photovoltaic effect, IEEE 1993, Photovoltaic Specialists Conference, 140-146.

Brown, AS, et al., Impurity photovoltaic effect: Fundamental energy conversion efficiency limits, J. Appl. Phys. 2002, 92: 1329-1336.

Huang, Z., et al., Microstructured silicon photodetector, Appl. Phys. Lett. 2006, 89: 033506-1-033506-3.

Sah, CT, et al., Recombination properties of the gold acceptor level in silicon using impurity photovoltaic effect, Phys. Rev. Lett. 1967, 40: 71-72.

Guttler, G., et al., Photovoltaic effect of gold in silicon, J. Appl. Phys. 1969, 40: 4994-4995.

Wagner, RS, Defects in silicon crystals grown by VLS technique, J. Appl. Phys. 1967, 38: 1554-1560.

Seibt, M., et al., Characterization of haze-forming precipitates in silicon, J. Appl. Phys. 1988, 63: 4444-4450.

(56) References Cited

OTHER PUBLICATIONS

Kelzenberg, MD, et al., Enhanced absorption and carrier collection in Si wire arrays for photovoltaic applications, Nature Materials 2010, 9: 239-244.
Garnett, EC, et al., Light-trapping in silicon nanowire solar cells, Nano Letters 2010, 10: 1082-1087.
Goto, H., et al., Growth of core-shell InP nanowires for photovoltaic application by selective-area metal organic vapor phase epitaxy, Applied Physics Express 2009, 2: 035004-1-035004-3.
Kelzenberg, MD, et al., Topograohical micropatterning of Poly(dimethylsiloxane) using laminar flows of liquids in capillaries, Advanced Materials 2001, 13: 570-574.
Aspnes, D.E., Properties of Crystalline Silicon, 1999, 683-690.

* cited by examiner

SEMICONDUCTOR WIRE ARRAY STRUCTURES, AND SOLAR CELLS AND PHOTODETECTORS BASED ON SUCH STRUCTURES

CROSS REFERENCE TO RELATED APPLICATIONS

The present application claims priority to U.S. provisional application 61/265,306 for "Light-trapping Si wire-array structure for solar cells and photodetectors" filed on Nov. 30, 2009, and U.S. provisional application 61/265,297 for "Selective p-n junction fabrication technique for high-aspect-ratio semiconductor microstructures" filed on Nov. 30, 2009, and U.S. provisional application 61/313,654 for "Processing Steps for the Fabrication of a Microwire Array Solar Cell" filed on Mar. 12, 2010, all three of which are herein incorporated by reference in their entirety. The present application is also related to U.S. patent application Ser. No. 12/956,422 for "Three-dimensional patterning methods and related devices" filed on even date herewith, also incorporated herein by reference in its entirety.

STATEMENT OF GOVERNMENT GRANT

This invention was made with government support under Grant Numbers DE-SC0001293 and grant DE-FG02-07ER46405 awarded by the U.S. Department of Energy. The US government has certain rights in the invention.

FIELD

The present disclosure relates to semiconductor microstructures, such as high-aspect-ratio of semiconductor microstructures. More in particular, the present disclosure relates to semiconductor wire array structures, such as silicon (Si) wire arrays structures, especially for solar cells and photodetectors.

BACKGROUND

Solar cells based on arrays of Si micro- or nanowires have been proposed as a potentially low-cost alternative to conventional wafer-based Si solar cells. See reference [1], incorporated herein by reference in its entirety.

Device physics modeling, based on experimentally measured properties of Si wires, has predicted that wires of micron-scale diameter will achieve the greatest photovoltaic energy conversion efficiency. See reference [2], incorporated herein by reference in its entirety. Such solar-cell structure should effectively absorb all above-bandgap incident sunlight, over a broad range of incidence angle.

SUMMARY

According to a first aspect of the disclosure, a structure is provided, comprising: an array of elongated semiconductor elements; an infill material located in a space between the elongated semiconductor elements; and a reflective material, configured to reflect incident light and direct the incident light to the elongated semiconductor elements.

According to a second aspect of the disclosure, a structure is provided, comprising: an array of elongated semiconductor elements; an infill material located between the elongated semiconductor elements; and an antireflective coating at least partially and superficially covering a respective elongated semiconductor element, the antireflective layer being interposed between the infill material and the respective elongated semiconductor element.

According to a third aspect of the disclosure, a structure is provided, comprising: an array of elongated semiconductor elements; an infill material located in a space among the elongated semiconductor elements; and a light scattering material included in the infill material and surrounding the elongated semiconductor elements.

According to a fourth aspect of the disclosure, a structure is provided, comprising: an array of substantially vertically oriented elongated semiconductor elements; an infill material located in a space among the elongated semiconductor elements; and a material applied at least partially on a surface of the infill material, said material being selected from the group consisting of: light scattering material, concentrating material, and a texture.

According to further aspects of the disclosure, solar cells, photoconverter devices and photoelectrochemical devices comprising the above structures are also provided.

Further aspects of the disclosure are shown in the specification, drawings and claims of the present application.

Appendix 1, Appendix 2, and Appendix 3 are filed together with the present application and form integral part of the specification of the present application.

BRIEF DESCRIPTION OF THE DRAWINGS

FIG. 5 shows a schematic partial cross sectional view of a structure according to yet another embodiment of the present disclosure.

DETAILED DESCRIPTION

With reference to FIGS. 1-22, the present disclosure describes structures, solar cells, photoconverts and/or photoelectrochemical devices comprising an array of semiconductor structures, an infill material between the semiconductor materials, and one or more of the following light-trapping elements: textured surfaces, light-concentrators, light-scatterers, antireflective layers, or reflective layers; or combinations of such elements. These light trapping elements can be opportunely located in the structures to direct incident light to the semiconductor materials. These light trapping elements can furthermore provide, in accordance with some embodiments, one or more of the following synergistic functionalities to photoconverters based on these structures: passivation of the semiconductor surfaces, conduction of electrical current, or structural support.

Figure 1:
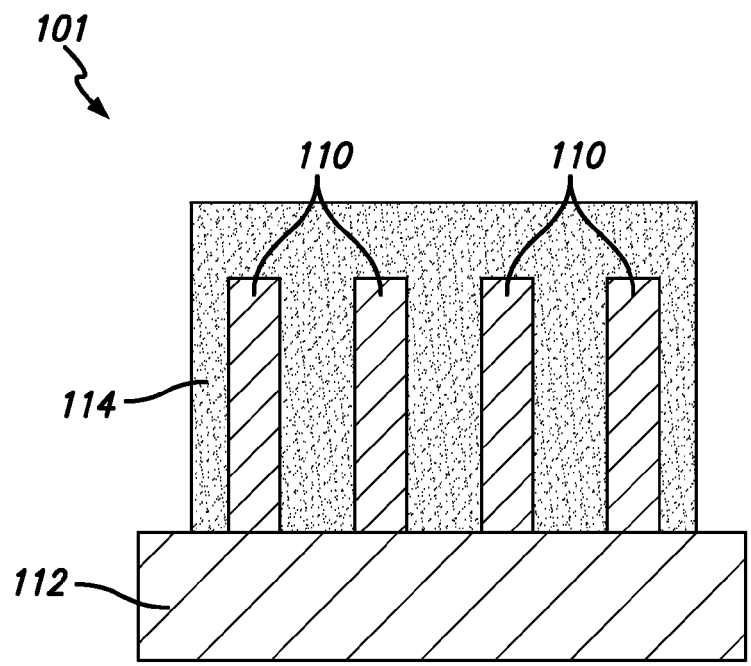
FIG. 1 shows a schematic partial cross sectional view of a baseline structure including a wire array.

FIG. 1 shows a schematic partial cross sectional view of a baseline structure (101) including an array of elongated semiconductor elements (110), such as Si wires. In general, FIGS. 1-12 and 16-22 show schematic partial cross sectional views of structures (102), (103), (104), (105), (106), (107), (108), (109), (1001), (1002), (1003) and further structures (1004) (1005), (1006), (1007), (1008), (1009) and (1010), according to respective embodiments of the present disclosure. All of the structures (102), (103), (104), (105), (106), (107), (108) (109), (1001), (1002), (1003), (1004), (1005), (1006), (1007), (1008), (1009) and (1010) can include the baseline structure (101) of FIG. 1.

The baseline structure (101) comprises an array of wires (110), such as elongated semiconductor elements, which, by way of example and not of limitation, is a square-tiled array of 67-μm-long Si wires (110) having an areal packing fraction of $\eta f = 4.2\%$. In such specific embodiment, the structure (101) contains the same volume of Si as a 2.8 μm-thick planar sheet of Si. Such array (101) shows peak absorption at normal incidence (<0.5), and increased absorption at steeper angles of incidence. The wires can have any kind of shape, such as a cylindrical shape and have the same shape. In other embodiments of the disclosure, the wires are cones, pyramids, wires or whiskers. Moreover, the semiconductor wires (110) can be tiled according to an ordered lattice pattern within the array. In a particular embodiment, the semiconductor wires are tiled to have a triangular, square, chimed triangular, chimed square, penrose, dodecagonal, or quasi-random ordered lattice pattern. Moreover, in some embodiments, the semiconductor elongated elements can be coated with additional materials for reasons other than the improvement of optical absorption.

The Si wires (110) extend from a substrate (112), for example a quartz slide, which is a well-suited substrate for optical transmission and reflection measurements. The Si wires (110) are embedded in a transparent casing, infill material or environment (114). The infill material (114) is generally transparent and has an index of refraction that is greater than 1.0 and less than that of the semiconductor material, including such materials such as a polymer casing, in particular polydimethlysiloxane (PDMS), air, EVA (ethylene vinyl acetate), liquids, oxides, mylar, or wax. In particular, the infill material (114) is located in a space between the elongated semiconductor elements or Si wires (110). The infill material (114) is able to effectively reduce the reflectivity of the semiconductor wires.

According to several embodiments, the structure (101) has non-subwavelength dimensions. The expression "subwavelength" is intended to mean that the wires or wire-like or elongated semiconductor elements (shaped e.g. as cylinders, cones, pyramids, elongated solids, tree-shaped elements etc.) have average minimum dimension (e.g. radius, width, etc.) that is less than the free space wavelength of sunlight, for wavelengths of sunlight having photon energy in excess of the semiconductor bandgap. In some embodiments, the elongated semiconductor elements have diameters of at least 1 microns, lengths of at least 20 microns or more and length to diameter ratios of at least 5. For silicon, the structure (101) has an average minimum dimension less than about 1100 nm (1.1 microns). According to further embodiments, the structure (101) includes non-Si elongated semiconductor elements, such as, for example Ge, GaP, GaAs, InP, InGaAs, SiC.

In some embodiments, the structure (101) has a packing fraction lower than 10%. In other words, in some embodiments, the volume occupied by the semiconductor material or wires forms less than 10% of the volume of the structure. In additional embodiments, the structure (101) has a packing fraction lower than 5%. In fact, the expression "packing fraction" or "aerial packing fraction" is defined as the relative percentage (by volume) of semiconductor material within the array structure. The structure is intended as including the semiconductor wires and other materials (voids, casing, particles, coatings, etc.) lying between the horizontal planes that confine the upper and lower extent of the wires and their coatings. As an example, an array of vertical cylindrical semiconductor wires tiled in a square lattice can be considered, in which each wire has height h and radius r and is spaced a distance 1 from adjacent wires. With reference to this example, the packing fraction is $\pi r^2 / l^2$. In some embodiments, a structure including the structure (101) is configured in such a manner that at least 80% of visible light incident on the structure from one or more angles of incidence is absorbed by the structure. More in particular, at least 50% of photons from the solar spectrum having energy greater than the semiconductor bandgap energy that are incident on the structure from one or more angles of incidence are absorbed within the semiconductor material. In some embodiments, the projected area of the semiconductor structures occupy less than 10% of the optical incidence plane.

Figure 2:
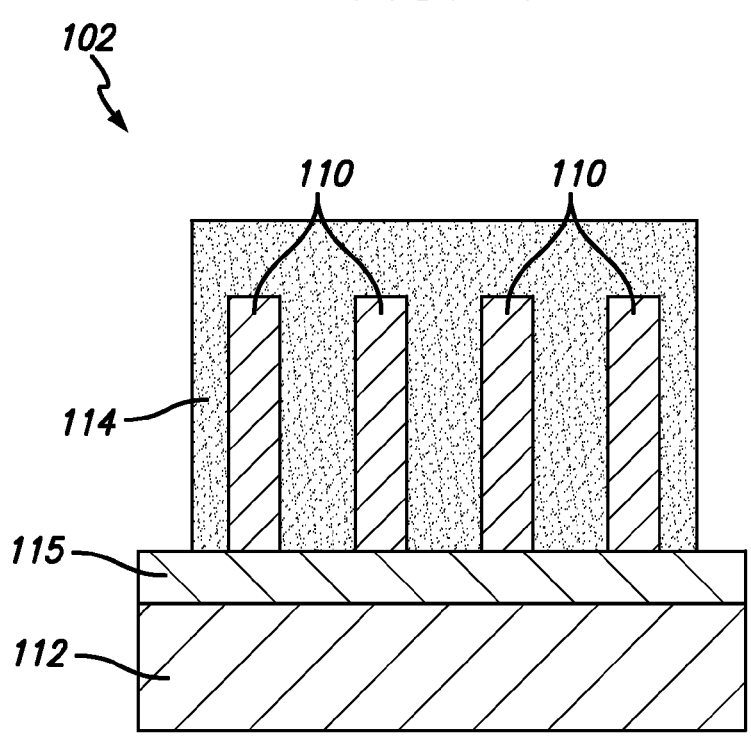
FIG. 2 shows a schematic partial cross sectional view of a structure according to an embodiment of the present disclosure.
Figure 17:
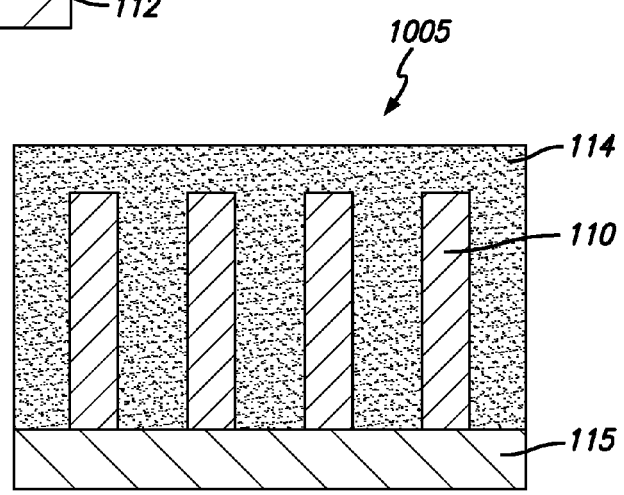
FIG. 17 shows a schematic partial cross sectional view of a structure according to a further embodiment of the present disclosure.
Figure 18:
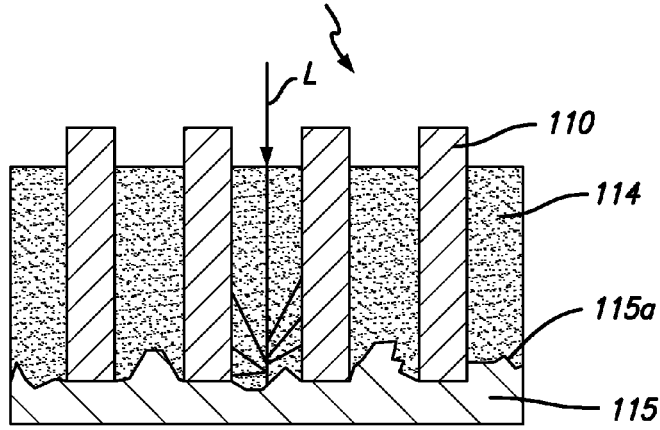
FIG. 18 shows a schematic partial cross sectional view of a structure according to a further embodiment of the present disclosure.
Figure 19:
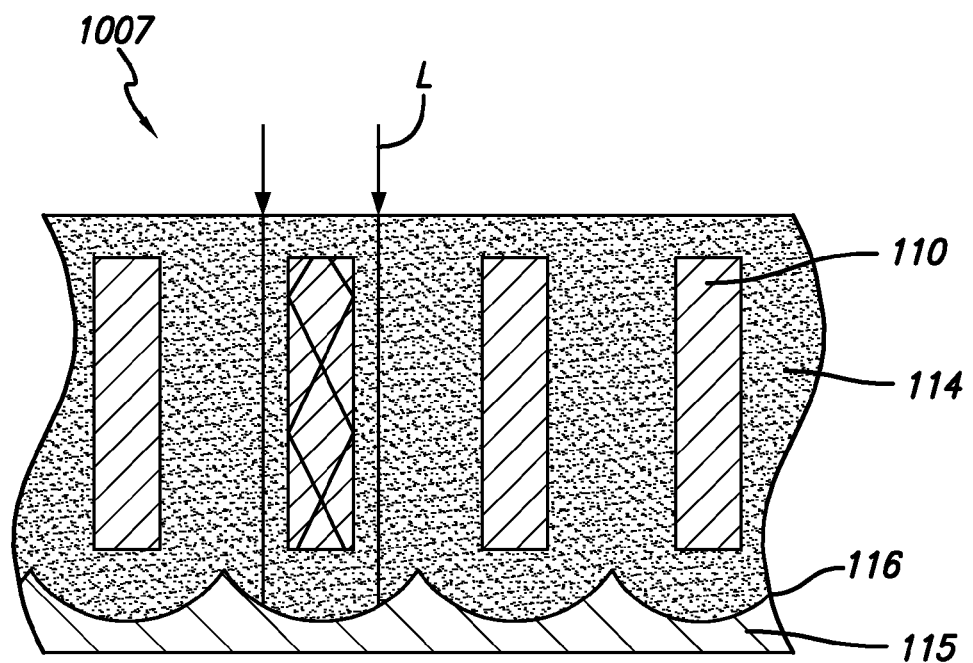
FIG. 19 shows a schematic partial cross sectional view of a structure according to a further embodiment of the present disclosure.
Figure 20:
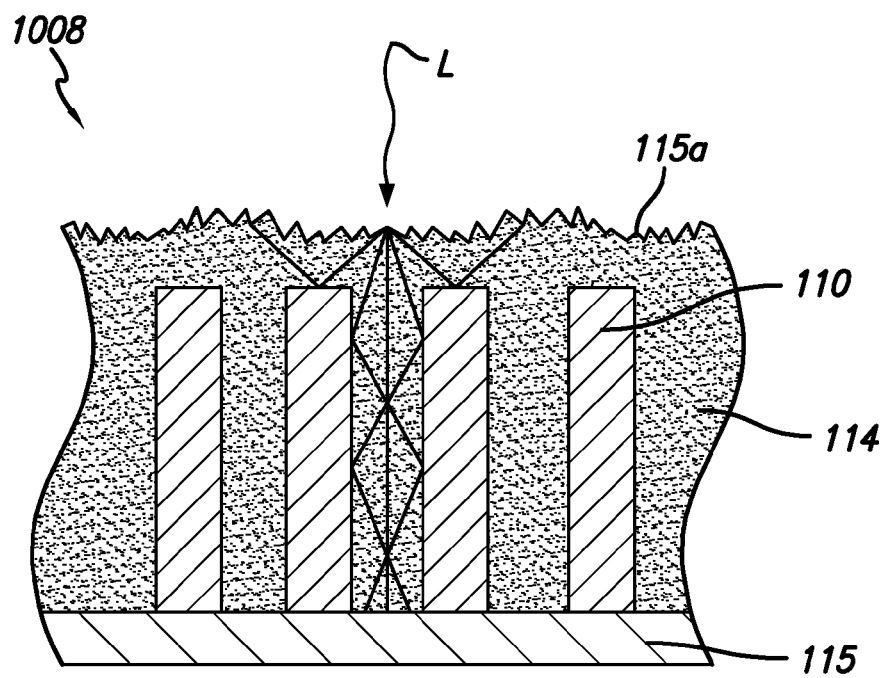
FIG. 20 shows a schematic partial cross sectional view of a structure according to a further embodiment of the present disclosure.

FIG. 2 shows a structure (102), which includes the structure (101) and further includes a back reflector (115), for example a metal layer, such as a minor-like Ag back-reflector, interposed between the Si wires (110) and the substrate (112). According to further embodiments, other metallic or dielectric back-reflectors, having specular or non-specular (e.g. Lambertian) reflectance, can be used instead of a minor-like Ag back-reflector. The back reflector can be made, for example, of metals like Al, Ag, Au, Cu, Ni, Ti, or In. In other embodiments, the back reflector (115) acts as substrate and entirely replaces the substrate (112), as shown in FIG. 17.

The back reflector (115) increases an optical path length within the array (102). In particular, the presence of the back reflector (115) increases the optical path length for absorption within the wire array (102) (approaching peak normal-incidence values of 0.8). In this embodiment, the normal-incidence absorption can remain weaker than that at off-normal-incidence angles because there is no randomization of light within the array. At normal incidence, light travels parallel to the wires, hits the back reflector, and then travels vertically upward again to escape the array structure without striking the wires.

According to further embodiments, the back reflector can be positioned only under the Si wires (110), or only under the infill material (114), or under both the Si wires (110) and the infill material (114). It follows that the back-reflector extend either partially over the entire substrate (112), as shown for example in the structure 1004 of FIG. 16 (where the back reflector is beneath the infill only) or beneath the entire structure as shown in the structure 1005 of FIG. 17.

According to further embodiments, light-scattering material or surface texture (115a) is applied on the back reflector (115). Such light-scattering material (115a) is able to change the direction of incident light upon reflecting from the back reflector in a manner so as to increase the optical path length within the structure, particularly from incidence at angles normal to the reflector. In one embodiment, the structure 1006, shown in FIG. 18, includes the back-reflector features random texture so as to produce Lambertian reflectivity. Such light-scattering causes light to strike the wires (110) that might otherwise have traveled between the wires without being absorbed. In one embodiment, such light-scattering is achieved through random surface texturing applied to the top surface of the infill material, as shown in the structure (1008) of FIG. 20, whereas in another embodiment such light-scattering is achieved through a curvature of the infill top surface near the wires due to surface tension, volumetric expansion or contraction, or other means, as shown in the structure (1009) of FIG. 22.

Figure 3:
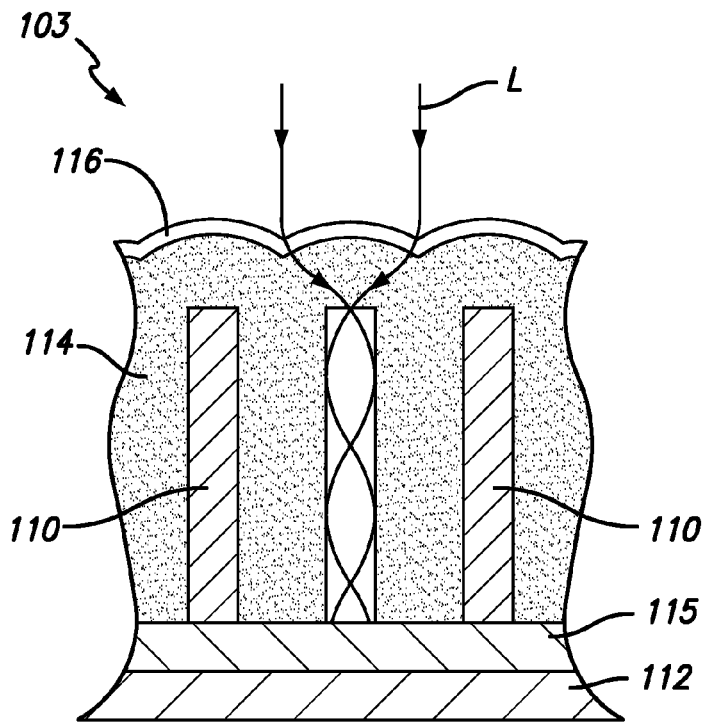
FIG. 3 shows a schematic partial cross sectional view of a structure according to another embodiment of the present disclosure.

FIG. 3 shows a portion of a structure (103), which is similar to the structure (102) of FIG. 2, and further includes a light-concentrating texture (116) located on the upper surface of the infill material (114) and facing the incident light (L). Such light-concentrating material (116) serves to change the direction of incident light upon transmission into the infill material or wires in a matter that increases the average optical path length within the structure. According to further embodiments, light-concentrating material or surface texture (116) is applied on the back reflector (115). Such light-concentrating material acts as a focusing reflector that focuses the light towards the Si wires (110) and improves light absorption. In one embodiment such light-concentrating texture (116) is approximated by parabolic dish reflectors beneath each wire (110), as shown in the structure (1007) of FIG. 19.

Figure 21:
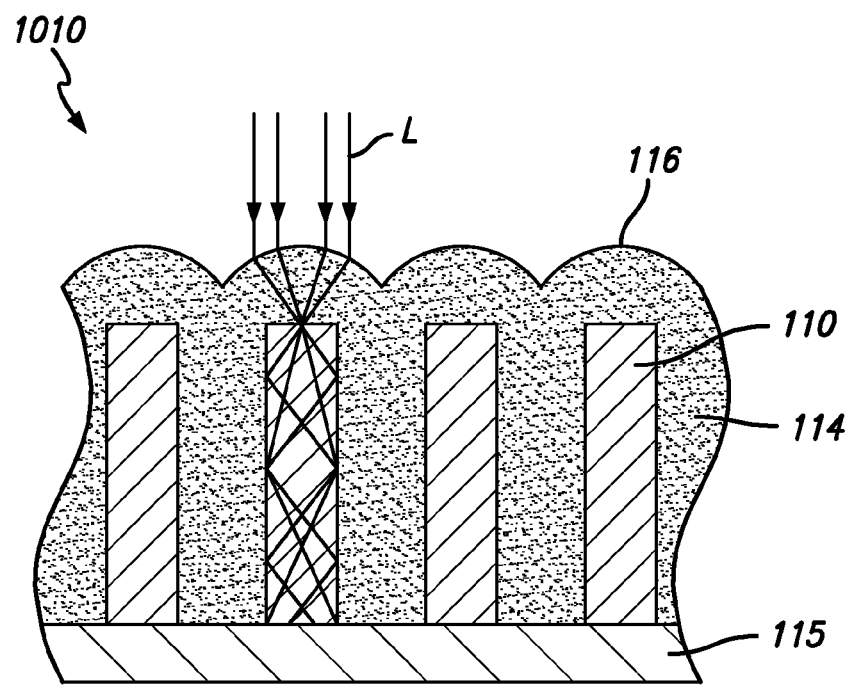
FIG. 21 shows a schematic partial cross sectional view of a structure according to a further embodiment of the present disclosure.
Figure 22:
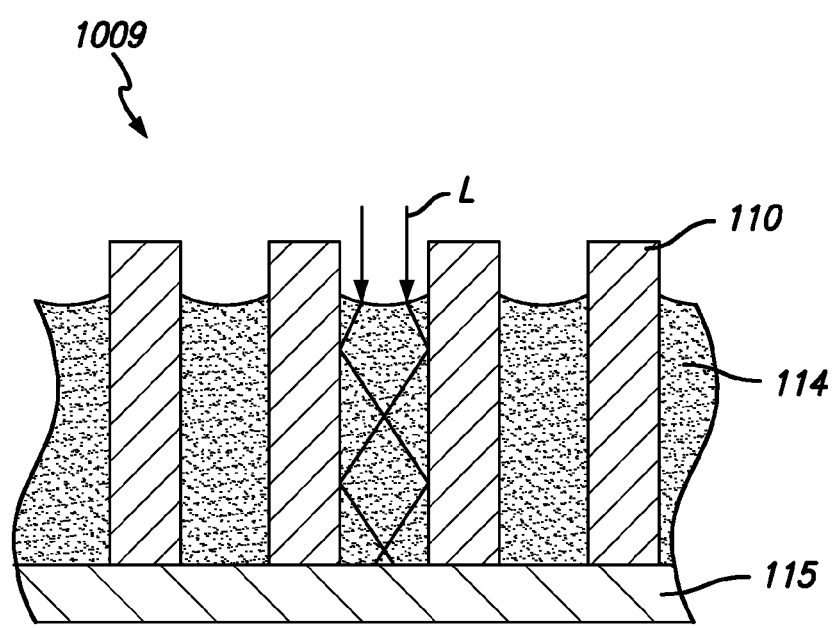
FIG. 22 shows a schematic partial cross sectional view of a structure according to a further embodiment of the present disclosure.

FIG. 21 shows a portion of a structure (1010), which is similar to the structure (102) of FIG. 2, and further includes a light-concentrating texture (116) located on the upper surface of the infill material (114) and facing the incident light (L). Such light-concentrating material (116) serves to focus the light (L) towards the Si wires (110) and improves light absorption, while decreasing the light acceptance angle of the structure. The structure (1010) differs from the structure (103) of FIG. 3 for the absence of any substrate physically distinct from the back reflector. In FIG. 21 the back reflector (115) acts as substrate.

Figure 4:
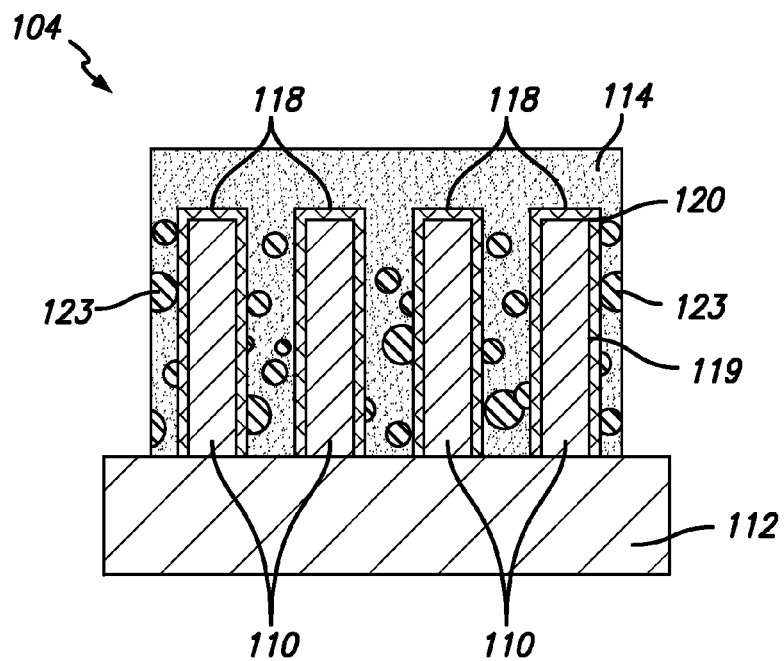
FIG. 4 shows a schematic partial cross sectional view of a structure according to a further embodiment of the present disclosure.

FIG. 4 shows a structure (104), which includes the structure (101) of FIG. 1, and further includes an antireflective coating (118) deposited on each Si wire (110). In the depicted embodiment, the antireflective coating consists of amorphous silicon nitride (a-SiN$_g$), which also serves as a surface passivation layer on the Si surfaces. According to further embodiments, other materials can be used instead of a silicon nitride antireflective layer, which may or may not also serve as surface passivation. Such surface passivation and/or antireflective coating (118) is deposited on the top (120) and side (119) walls of the Si wires (110). According to further embodiments, the antireflective coating (118) partially covers the surfaces of the Si wires (110). In the embodiment of FIG. 4 the surface passivation antireflective coating (118) is, for example, a-SiN$_x$ AR-coating (e.g., 80 nm nominal thickness) and is deposited on the Si wires (110) prior to embedding the Si wires (110) in the infill or casing (114). According to further embodiments the antireflective coating (118) can include one or more of nitrogen, oxygen, hydrogen, and/or silicon.

According to further embodiments, the antireflective layer (118) varies in thickness along a surface of the elongated semiconductor elements, for example, to minimize reflection of certain wavelengths of light at various positions along the elongated semiconductor elements. For a simple quarter-wave antireflective coatings, the ideal layer thickness depends directly on the wavelength of light, which for solar applications, can span from 280-4000 nm, as well as the refractive index of the antireflective material. By varying the antireflective layer thickness along the surface of the elongated semiconductor structure, optimal antireflection for one particular wavelength can be achieved at one location along the structure, whereas optimal antireflection for a different wavelength can be achieved elsewhere along the structure. According to a further embodiment, the antireflective layer (118) varies in composition along a surface of the elongated semiconductor elements. In one embodiment, the antireflective layer consists of a transparent conductive oxide such as indium tin oxide at the tops of the elongated semiconductor elements, and a transparent dielectric such as silicon nitride along the sides of the elongated semiconductor elements. This configuration is beneficial for solar cells comprising arrays of elongated semiconductor structures, wherein the conductive top-layer antireflective material also serves as a device electrode, and wherein the dielectric sidewall antireflective material also serves as a surface passivation layer. In further embodiments, light scattering materials are further applied on the antireflective layer (118). In some embodiments, the antireflective coating is produced by plasma-enhanced chemical vapor deposition.

The structure (104) of FIG. 4 also includes light scattering particles (123), for example Al$_2$O$_3$ particles (e.g., 0.9 μm nominal diameter). Such particles are added to the infill material (114) and laterally surround the Si wires (110), to scatter the light that might otherwise pass between the Si wires (110). In particular, in some embodiments, the light scattering particles (123) uniformly surround all of the sides (119) of the Si wires (110). According to further embodiments, instead of the light scattering particles (123), the structure includes light-scattering elements selected from the group including void, bubble, dielectric composition, metal particle, and a polymer. In particular, the dielectric composition comprises one element selected from the group including $Al_2O_3$, $BaSO_4$, $TiO_2$, $SiO_2$ and the metal particle comprises one element selected from the group including Ag, Au, Ni, Al and Cu.

Figure 5:
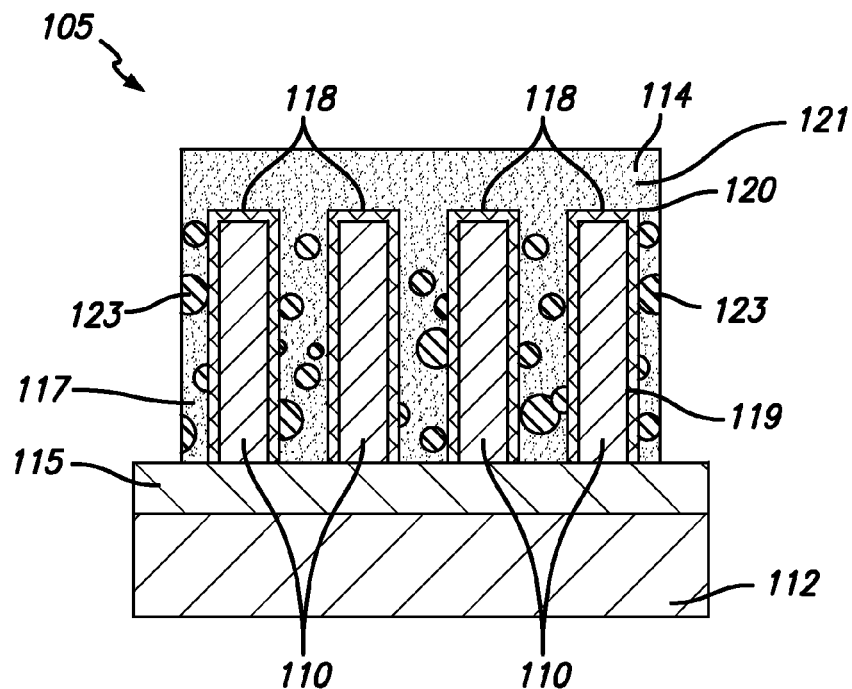
FIG. 5 shows a schematic partial cross sectional view of a structure according to a further embodiment of the present disclosure.

In FIG. 5, the infill material (114) includes an infill bottom zone (117) and a different infill top zone (121). Concentration of the light scattering elements (123) is greater in the infill bottom zone (117) than in the infill top zone (121). In other words, the light scattering elements (123) are concentrated near the bottom of the wire array in a zone opposite to the incident light, or near the substrate, and more diffused or less concentrated in a zone faced to the incident light. In this way, light that is reflected or scattered upwards has more distance with which to interact with the wires, thus increasing the probability of absorption. Similar results can be obtained when density of the light scattering elements (123) is higher in the infill bottom zone (117) than in the infill top zone (121). These results can be obtained, for example, by centrifugation to force the particles to the bottom. In other embodiments, the light-scattering structure or material within the infill material is varied in density or composition with proximity to the semiconductor structures. In other words, concentration of the light scattering elements (123) is higher in proximity to the elongated semiconductor elements (110) than in a far zone thus further increasing the probability of absorption into the elongated semiconductor elements (110). In some embodiments, the light-scattering material within the infill material (114) comprises the incorporation of a translucent material, such as wax or a white polymer to increase the scattering capacity of the light-scattering material. In other embodiments, light-scattering structure within the infill material comprises voids of the material or bubbles of air. Moreover, in some embodiments, in order to further increase the probability of absorption into the elongated semiconductor elements (110) the light-scattering material is applied to the surface of the semiconductor, infill, antireflective, or reflective materials.

With continued reference to FIG. 4 and FIG. 5, the structure (104) and the structure (105) can include a light-scattering material located on the upper surface of the infill material (114) and facing the incident light. Such light-scattering material scatters the light towards the Si wires (110) and improves light absorption, as already described above. According to further embodiments, a light-scattering material is placed on the surface of the infill material.

Such surface passivation antireflective coating (118) and light scattering particles (123) were chosen because they have negligible absorption across defined wavelengths of 500-1100 nm, and thus enable a direct observation of absorption enhancement within the Si wires (110) themselves. The surface passivation antireflective coating (118) and light scattering particles (123) virtually eliminate an angular sensitivity of the wire array's absorption, and increase the peak normal-incidence absorption to 0.92. This is desirable because maximal absorption is desired at normal incidence for most solar applications. If the absorption is significantly less at normal incidence than for other angles, then a solar cell will produce less electricity when the sun is directly overhead, when there is the greatest potential to produce solar energy.

FIG. 5 shows a structure (105) which is similar to the structure (104) of FIG. 4 and further includes the back reflector (115) such as the Ag back-reflector shown in FIG. 2. It follows that the structure (105) of FIG. 5 differs from the structure (104) of FIG. 4 for the presence of the back reflector (115).

It is noted that such presence of the back reflector determines, in some embodiments, an array's peak absorption increasing to 0.96, which is nearly the maximal absorption achievable by any material fully embedded within an infill (114) such as PDMS due to the about 3% reflectivity of the PDMS-air dielectric interface.

Figure 6:
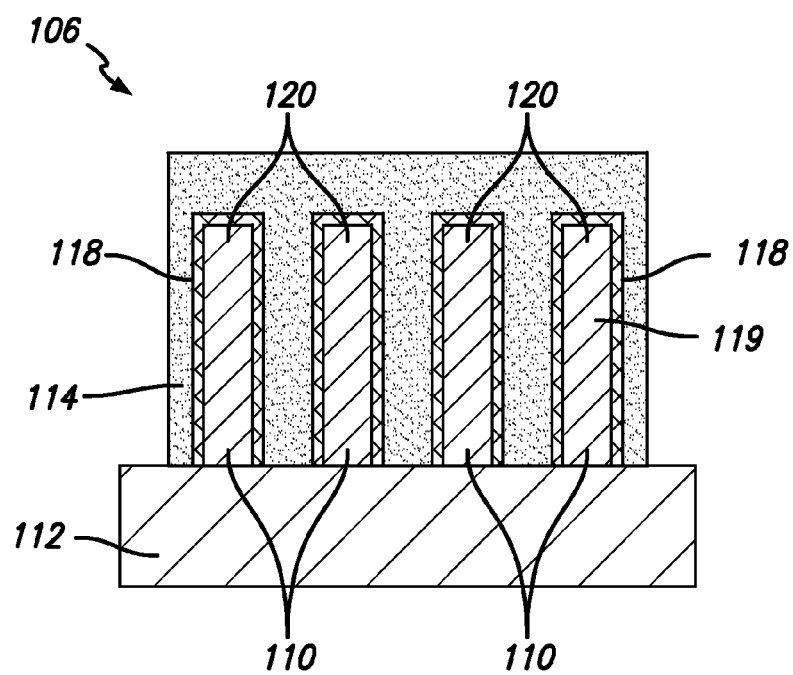
FIG. 6 shows a schematic partial cross sectional view of a structure according to still another embodiment of the present disclosure.

FIG. 6 shows a structure (106), which includes the structure (101) of FIG. 1, and further includes the previously described surface passivation antireflective coating (118), placed on each Si wire (110). The surface passivation antireflective coating (118) is deposited onto the top (120) and side (119) walls of the Si wires (110).

Figure 7:
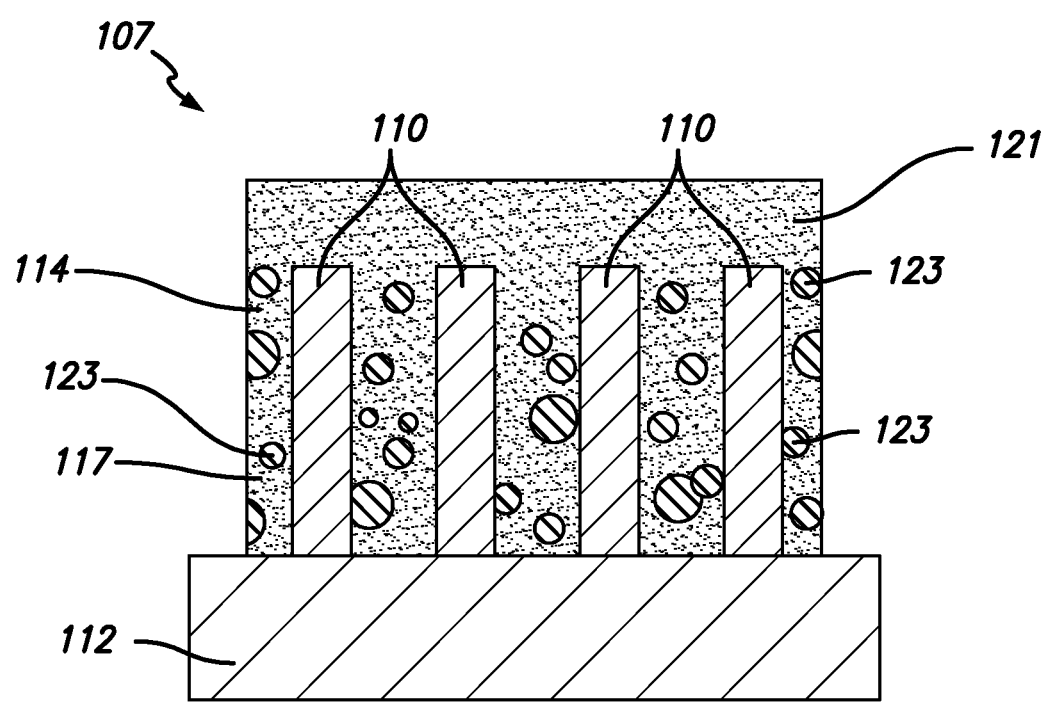
FIG. 7 shows a schematic partial cross sectional view of a structure according to a further embodiment of the present disclosure.

FIG. 7 shows a structure (107), which includes the structure (101) of FIG. 1, and further includes the previously described light scattering particles (123), for example $Al_2O_3$ particles (0.9 μm nominal diameter). Such particles are added to the infill and randomly surround the Si wires (110), to scatter the light that might otherwise pass between the Si wires (110). In particular, the light scattering particles (123) surround the Si wires (110) near the bottom.

Figure 8:
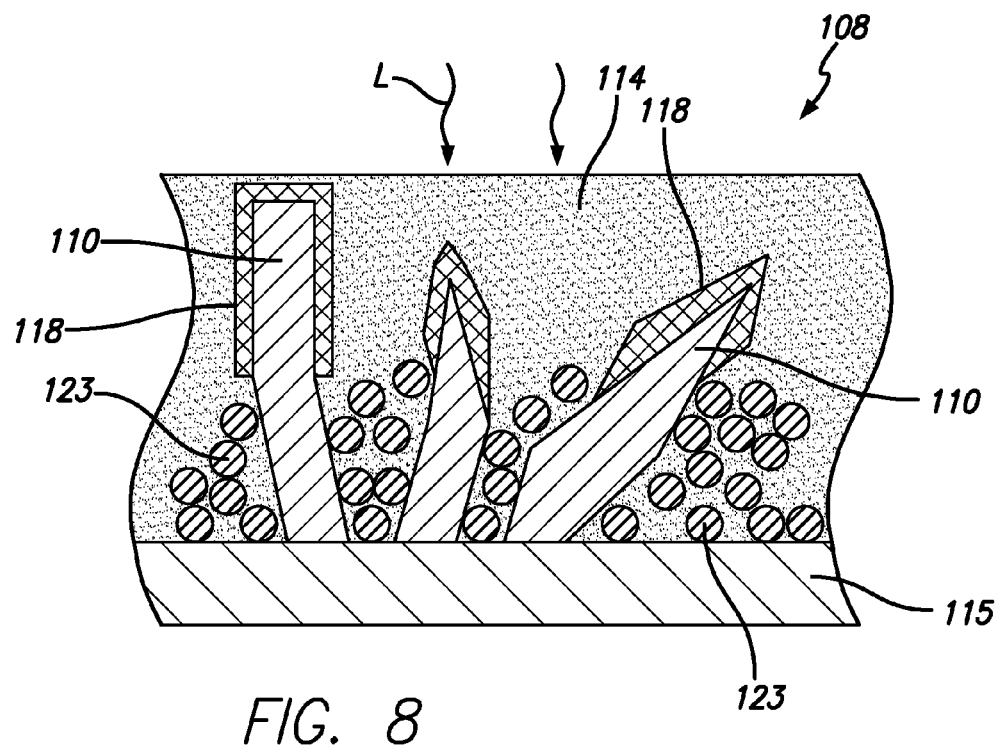
FIG. 8 shows a schematic partial cross sectional view of a structure according to a further embodiment of the present disclosure.

FIG. 8 shows a structure (108) which is similar to the structure (105) of FIG. 5, with the difference that the coating (118) is located only on the top of the elongated elements or wires (110), facing the incident light (L). Moreover, the structure (108) includes elongated semiconductor elements (110), which are randomly located and randomly oriented. Moreover the elongated semiconductor elements (110) present angled or angular or sharp profile. Both these features increase, in combination with light scattering material or texture material or reflective material, the probability of light absorption.

Figure 9:
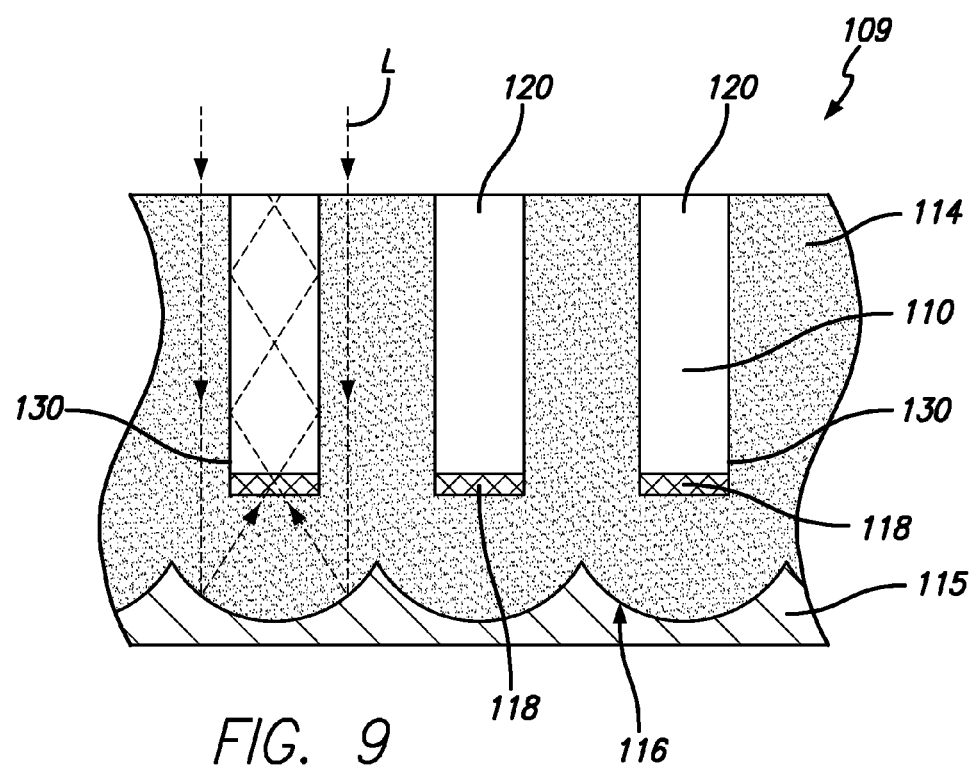
FIG. 9 shows a schematic partial cross sectional view of a structure according to a further embodiment of the present disclosure.

FIG. 9 shows a structure (109) according to a further embodiment of the present disclosure which includes an array of elongated semiconductor elements (110). The semiconductor elements (110) have top ends (120) and free bottom ends (130). The semiconductor elements (110) are embedded in the infill material (114) and the antireflective coating (118) is located on a free bottom end (130) of the elongated semiconductor elements (110). The structure (109) further includes a back reflector (115) which is shaped as a concentrating lens (116). The concentrating lens (116) focuses some or all of the light (L) incident on the structure (109) onto the smaller area occupied by the semiconductor wires.

According to a further embodiment of the present disclosure, a structure comprises an array of elongated semiconductor wires, such as the structure (101) disclosed above, wherein the semiconductor wires are generally oriented vertically; and an optical concentrator element, such as, for example, the concentrating lens (116) mentioned above that focuses some or all of the light incident on the structure onto the smaller area occupied by the semiconductor wires. According to further embodiments, light concentrators are placed on the semiconductor wires. In some embodiments, the concentrating lens (116) can be included in any one of the embodiments of FIGS. 2-8, 10-12 and 16-22.

The focusing lens (116) can focus the light to one or more of the semiconductor wires. According to a further embodiment, the concentrator element is below or adjacent to one or more of the semiconductor wires. According to further embodiments, the average cross-sectional area of the semiconductor wires within the array comprises less than 10% of the cross-sectional area of the optical incidence plane. In particular, the absorption of light (L) within the semiconductor material decreases to less than 50% of the value produced under normal-incidence illumination for illumination incidence angles exceeding 45° from normal.

The infill material can be textured to produce the focusing lens above one or more of the semiconductor wires. According to further embodiments, the focusing lens is coated with a reflective material to produce a focusing reflector below or adjacent to one or more of the semiconductor wires. The surface texturing can be produced by the contraction of the infill material, surface tension of the infill material, particles or voids within the infill material, imprint lithography, or casting. The semiconductor wires can be tiled according to an ordered lattice pattern within the array, and the ordered array of focusing lenses is positioned above the structure or an ordered array of focusing reflectors is positioned below the structure.

Figure 10:
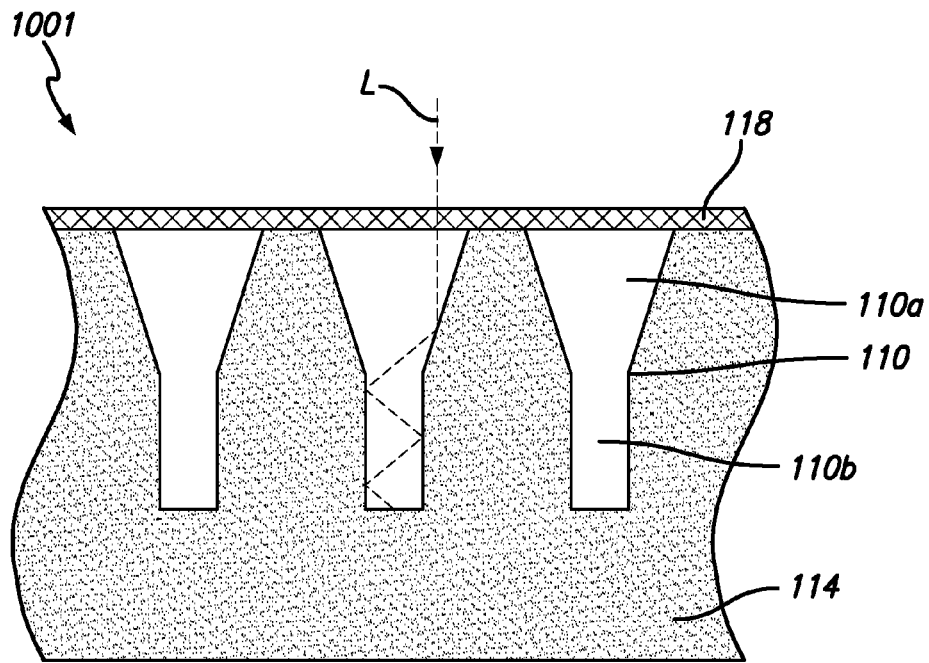
FIG. 10 shows a schematic partial cross sectional view of a structure according to another embodiment of the present disclosure.

FIG. 10 shows a structure (1001), which includes an array of semiconductor wires or cones generally vertically oriented, wherein the diameter of one or more wires or cones is flared near either or both ends of the structure, to produce a feed horn structure including at least one elongated portion (110b) and one flared portion (110a), or a truncated cone portion. The flared portion (110a) faces the incident light (L). The average diameter of each wire or cone (110) is sufficiently large to support guided optical modes within the semiconductor material. Instead of the feed horn structure, the structure (1001) can include a plurality of truncated cone wires.

According to further embodiments, the flared portion (110a) can be opposite to the incident light (L). Additionally, the cross-sectional area of the larger end of the flared portion (110a) can be at least four times the average cross-sectional area of the elongated portion of the semiconductor wire. The taper in the diameter of the feed horn structure or of a truncated cone wire can provide total internal reflection of light incident into the wire at normal incidence.

The structure (1001) of FIG. 10 includes an antireflective layer (118) placed on the top of the infill material (114). Other trapping light elements can be present, such as the focusing lens (116) and/or the light scattering particles (123) and/or the back reflector (115), as also those described in structures (102)-(109).

According to further embodiments, the feed horn structure, or each truncated cone wire, is produced by an increase or decrease in the diameter of a semiconductor wire or cone during its growth. The feed horn structure can be produced by etching a semiconductor wire or of a cone. The feed horn structure can produced at the bottom of a semiconductor wire or cone and then subsequently relocated to top of the structure by removing the wire or cone from the original support substrate and turning it upside-down.

Figure 11:
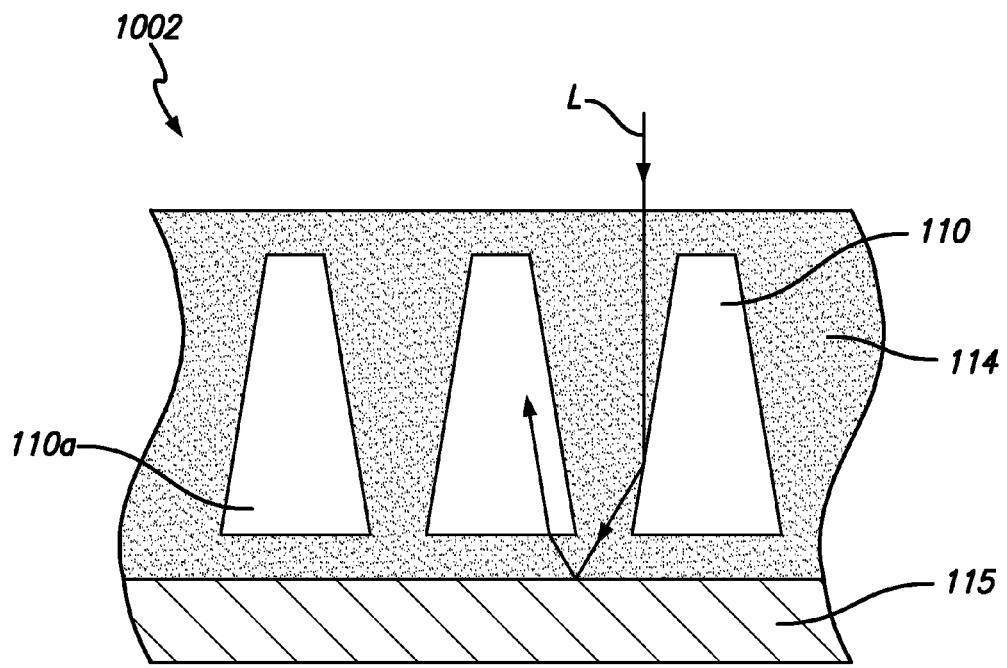
FIG. 11 shows a schematic partial cross sectional view of a structure according to yet another embodiment of the present disclosure.

FIG. 11 shows a structure (1002) according to a further embodiment of the disclosure. In particular, the structure (1002) includes wires having frusto-conical shape or feed horn structure as in the embodiment of FIG. 10, and a back reflector (115) placed under the wires (110). A larger flared portion (110a) of the frusto-conical wires (110) is located opposite to the incident light (L).

Figure 12:
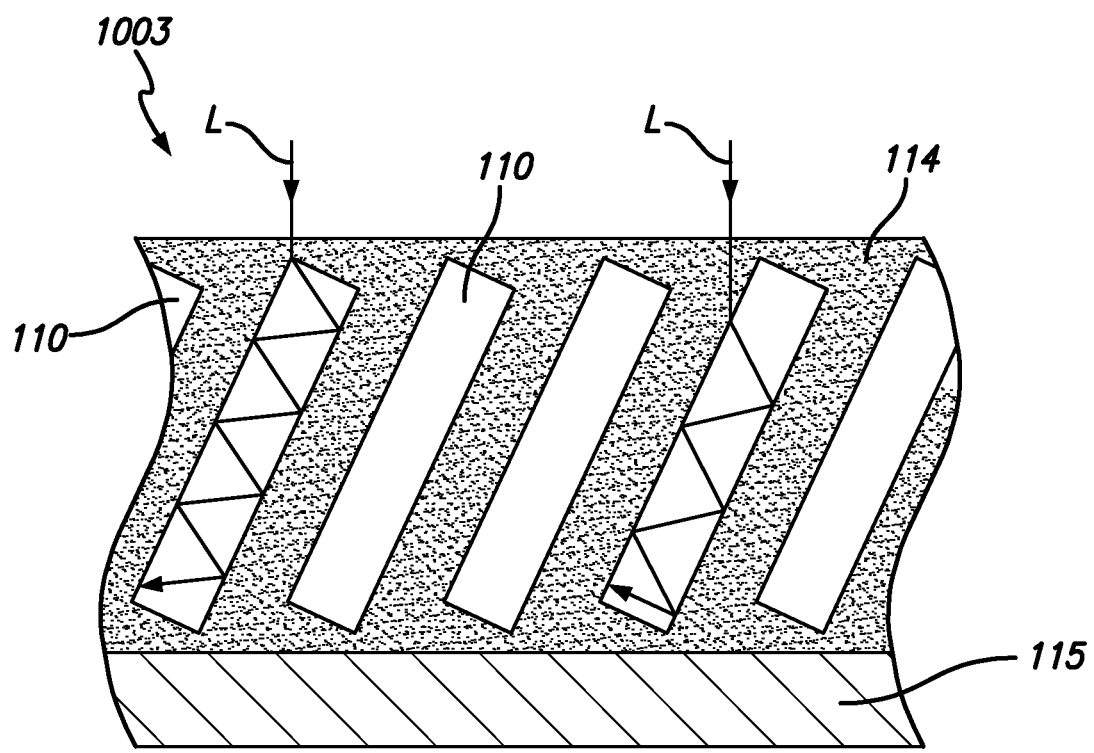
FIG. 12 shows a schematic partial cross sectional view of a structure according to still another embodiment of the present disclosure.

FIG. 12 shows a structure (1003) according to a further embodiment of the present disclosure. In particular, the structure (1003) comprises an array of semiconductor wires (110), which are tilted to a non-vertical orientation so as to increase the projected cross-sectional area of the semiconductor wires within the optical incidence plane at normal-incidence illumination. In the embodiment of FIG. 12, the wires (110) are generally oriented parallel to one another and share similar diameter and height.

According to further embodiments, the non-vertical orientation of the semiconductor wires is produced by growing the wires on a substrate in a manner that yields non-vertical growth, or by etching the wires from a substrate in a manner that yields non-vertical wires. According to alternative embodiments, the non-vertical orientation of the semiconductor wires is produced by growing or etching the wires in a manner that yields vertical or near vertical wires, then embedding the wires within an infill material and exerting a sheer force such that the wires remain tilted at a non-vertical angle within the plane of the structure.

The structure (1003) of FIG. 12 includes the back reflector (115) placed under the infill material (114). Other trapping light elements can be present, such as the focusing lens (116) the light scattering particles (123), the antireflective coating (118), and/or those described in structures (102)-(109).

The structures (101), (102), (103), (104), (105), (106), (107), (108), (109), (1001), (1002), (1003), (1004), (1005), (1006), (1007), (1008), (1009) and (1010), or any combination of such structures, described above can be manufactured according to the technique described in reference [3], incorporated herein by reference in its entirety. Si wires (110) are grown on p type <111> Si wafers ($\rho<0.001$ $\omega \cdot$cm), using, for example, a 300 nm thermal oxide for catalyst confinement and evaporated Au, Cu, or Ni (400-700 nm thickness) as the VLS catalyst. No notable differences were observed between the optical properties of wires grown using Au, Cu, or Ni catalyst metal.

Following growth, the wire arrays were etched in 5% HF(aq) for 30 s. To remove the catalyst metal, Au-catalyzed wires were then etched for 30 min in a solution of 9:1 Gold Etchant TFA (Transene) to 36% HCl(aq) and then rinsed for 30 s in 5% HCl(aq). Cu- and Ni-catalyzed wires were instead etched for 20 min at 70° C. in a 6:1:1 solution of $H_2O:H_2O_2:HCl$. Both groups of wires were then HF-etched as described above, dried, and momentarily dipped in a 50% (wt) solution of KOH (aq) at 55° C., to remove ~20 nm of Si, thus removing the metal-rich surface layer observed in similarly grown wires. For the structures including surface passivation antireflective coating (118), a $SiN_x$ film of 80-nm nominal thickness was conformally deposited onto the wire arrays by plasma-enhanced CVD at 350° C. In some embodiments, the reflective material comprises the substrate on which the elongated semiconductor structures were grown, or the substrate from which the elongated semiconductor structures were etched.

The lengths, diameters, and areal fractions of each wire array can be determined by computer-processing of high-resolution SEM images, taken from a 200×200 μm area at the center of each array. Only near-perfect wire arrays, defined as those that had at most one defect within this area (e.g. non-vertical or spurious growth, or a wire missing from the pattern), were considered. Arrays were embedded in PDMS and peeled-off.

The PDMS can be, for example, drop-cast, spun at 3000 rpm, and then cured at 120° C. for ≥1 hr, resulting in a smooth film whose overall thickness ranged from 10 to 50 μm greater than the height of the wire array. Subsequently, the wire arrays are transferred on the quartz slides for optical measurements. The arrays themselves are flexible polymer films, and could be transferred to any substrate (e.g. a window) or left as a free-standing flexible film. They have properties similar to a window decal.

For the structures which incorporate light scattering particles, e.g. $Al_2O_3$ light-scatterers, particles of 0.9 μm nominal diameter, whose surfaces had been modified with trimethylchlorosilane, were dispersed into $CH_2Cl_2$ by sonication. This solution was mixed into the PDMS to yield a ratio of 1:10:10

Al$_2$O$_3$:CH$_2$Cl$_2$:PDMS by weight. The suspension was drop cast, spun, and cured as described above. Prior to curing, the arrays were centrifuged for several minutes to drive the Al$_2$O$_3$ particles towards the bottom of the PDMS layer. In particular, in some embodiments, light-scattering materials are placed between the semiconductor structures before the infill material is added to the structure. The light-scattering materials can be mixed into the infill material before the infill is added to the structure. In some embodiments, the light-scattering property of the infill material is produced by a chemical process following the addition of the infill material to the structure. In some embodiments, the composition of the infill material is varied as it is added to the structure to produce an inhomogeneous distribution of light-scattering materials or structures within the structure. In some embodiments the distribution of light-scattering materials or structures is produced through evaporation or contraction of the infill material. For the structures including the back reflector, such back reflector is placed on the quartz slides using a thermal evaporator. Each array is placed on a clear quartz slide or a metal-coated one to compare their absorption with vs. without the back reflector. In an envisioned solar cell (FIG. 8) the metal would be deposited directly onto the wire arrays rather than onto quartz slides. In that case, it would also serve as a back metal contact. For structure including light-scattering texture such texture is produced by the contraction of the infill material, surface tension of the infill material, particles or voids within the infill material, imprint lithography, or casting.

To provide a figure of merit for the absorption measurements, the overall fraction of above-bandgap photons that each wire array would absorb throughout a day of operation as a non-tracking solar cell, $A_{avg}$, was calculated based on a time-resolved reference spectrum of direct solar insolation, see reference [4], incorporated herein by reference in its entirety, in conjunction with the measured angle- and wavelength-dependent absorption values of the wire arrays of FIGS. 2-5. $A_{avg}$ calculations that correspond to the absorption measurements are compared with the $A_{avg}$ calculation that corresponds to the measured absorption of a commercial, 280-μm-thick polycrystalline Si solar cell with a dielectric AR-surface passivation antireflective coating. In a particular embodiment, the optimal Si wire array (105) of FIG. 5 exhibited $A_{avg}$=0.85, which although slightly below that of the commercial Si solar cell ($A_{avg}$=0.87), is remarkable considering that this wire array film contained ~1% as much Si (per specimen area) as the commercial solar cell. This volume reduction implies substantial optical concentration within the Si wires.

To further gauge the absorption enhancement of the wire array geometry, the measured absorption, $A_{WA}(\theta_x, \lambda)$, of the wire array (105) from FIG. 5 was compared to the theoretical absorption limits of a "equivalently thick" (2.8 μm) planar Si absorber. Based on bulk Si properties, see reference [5], incorporated herein by reference in its entirety, and neglecting interference effects, two theoretical absorption limits were calculated for the equivalently thick Si slab: i) $A_{Si}$, which results from the use of bare, non-textured Si surfaces (black); and ii) $A_{LT}$, which results from ideal classical light-trapping at the Si surfaces. The latter case, the "Ergodic limit," is the maximally achievable absorption (in the ray-optic limit) of a planar-sheet absorber that utilizes ideally random (e.g. Lambertian) light trapping, see references [6], [7], incorporated herein by reference in their entirety.

The wire array's absorption exceeds the planar light-trapping limit for infrared wavelengths (λ>800 nm). This behavior exemplifies a useful property of micro-structured, non-planar absorber geometries (including wire arrays), in that they can achieve greater absorption per material volume than achievable by a randomly textured, planar-sheet absorber geometry. This effect has been described, through use of a statistical ray optics model, for idealized films of polymer-embedded Si granules, see reference [7], and has also been simulated for Si wire arrays, see references [8] and [9], incorporated herein by reference in their entirety. The enhanced infrared absorption of the Si wire array yielded a greater overall absorption of above-bandgap photons than the equivalently thick, ideally light-trapping planar absorber. In fact, taking all measured incidence angles into account, the day-integrated absorption of the wire array ($A_{avg}$=0.85) slightly exceeded that of the planar light-trapping case ($A_{avg}$=0.82). Thus, the Si wire array geometry can enable solar cells that reach, and potentially even exceed, the theoretical absorption limit, per volume of Si, of ideal light-trapping within a conventional planar geometry.

Figure 15:
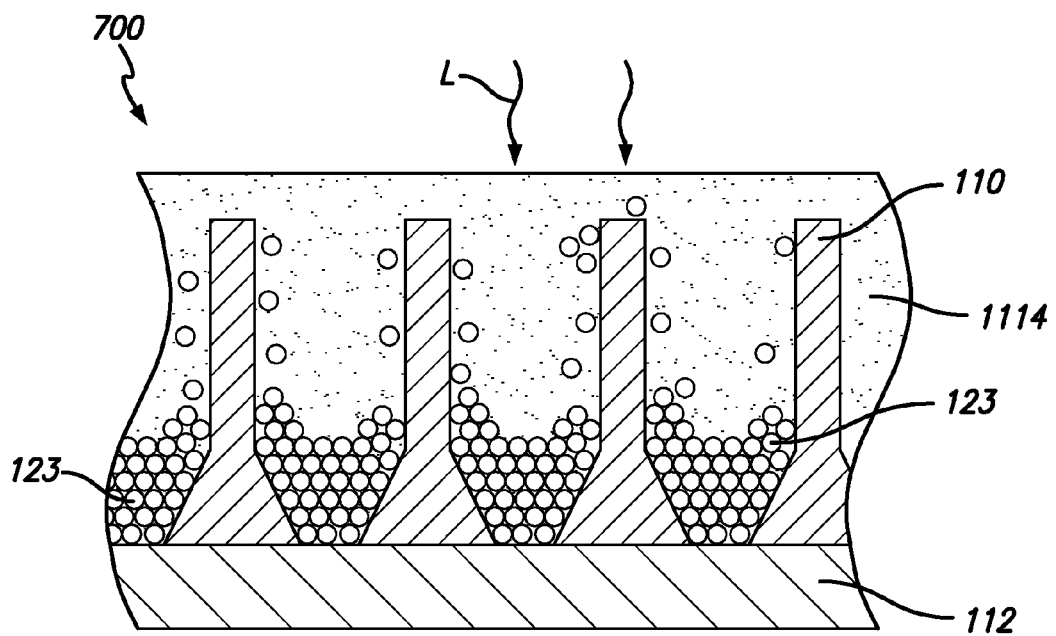
FIG. 15 shows a schematic partial cross sectional view of a photoelectrochemical device in accordance with the present disclosure.
Figure 16:
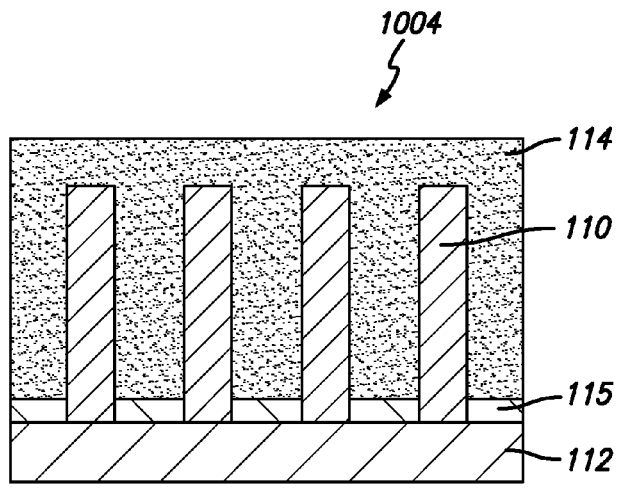
FIG. 16 shows a schematic partial cross sectional view of a structure according to a further embodiment of the present disclosure.

The enhanced absorption properties of Si wire arrays enable high quantum efficiencies for photovoltaic applications. To demonstrate this, a photoelectrochemical cell was used to measure the external quantum efficiency (EQE) of Si wire-array photoelectrodes, which consisted of p-type wire arrays grown on degenerately doped (and thus photovoltaically inactive) Si wafers. The transparent electrolyte formed a rectifying junction to the top and sides of each wire (analogous to a radial p-n junction), enabling photoelectrochemical characterization of the angle- and wavelength-dependent EQE of the wire-array electrode. However, because the wires were immersed in an electrolyte and attached to their growth substrate, this technique did not permit the use of a polymer infill, a dielectric antireflective coating and/or a planar metal back-reflector. Thus, relatively long (130 μm) and sparse ($\eta_f$=6.2%) square-tiled wire arrays were grown, to minimize the transmission of light into the photovoltaically inactive growth substrate while also minimizing the area of the reflective top surface of the Si wires. This geometry yielded up to 0.85 peak EQE, but suffered from substantially reduced EQE at normal incidence. Evaluating the EQE across the day-integrated solar spectrum (as carried out for $A_{avg}$ above) yielded EQE$_{avg}$=0.56. When Al$_2$O$_3$ light-scattering particles were drop-cast into this wire array, the normal-incidence 'dead spot' was virtually eliminated, the peak EQE increased to 0.89 and the day-integrated EQE$_{avg}$ increased to 0.68. This value is significant, considering that the photoelectrochemical cell configuration precluded the use of a metal back-reflector or an antireflective coating, both of which are known to substantially improve the optical absorption as described above, and both of which could be used within a solid-state, radial p-n junction wire-array solar cell. Thus, the results described here represent lower bounds, rather than upper limits, on the EQE that could be achieved by use of the Si wire-array geometry making use of the light-trapping elements disclosed herein. The configuration of the electrode described in this paragraph is depicted in FIG. 15.

Figure 13:
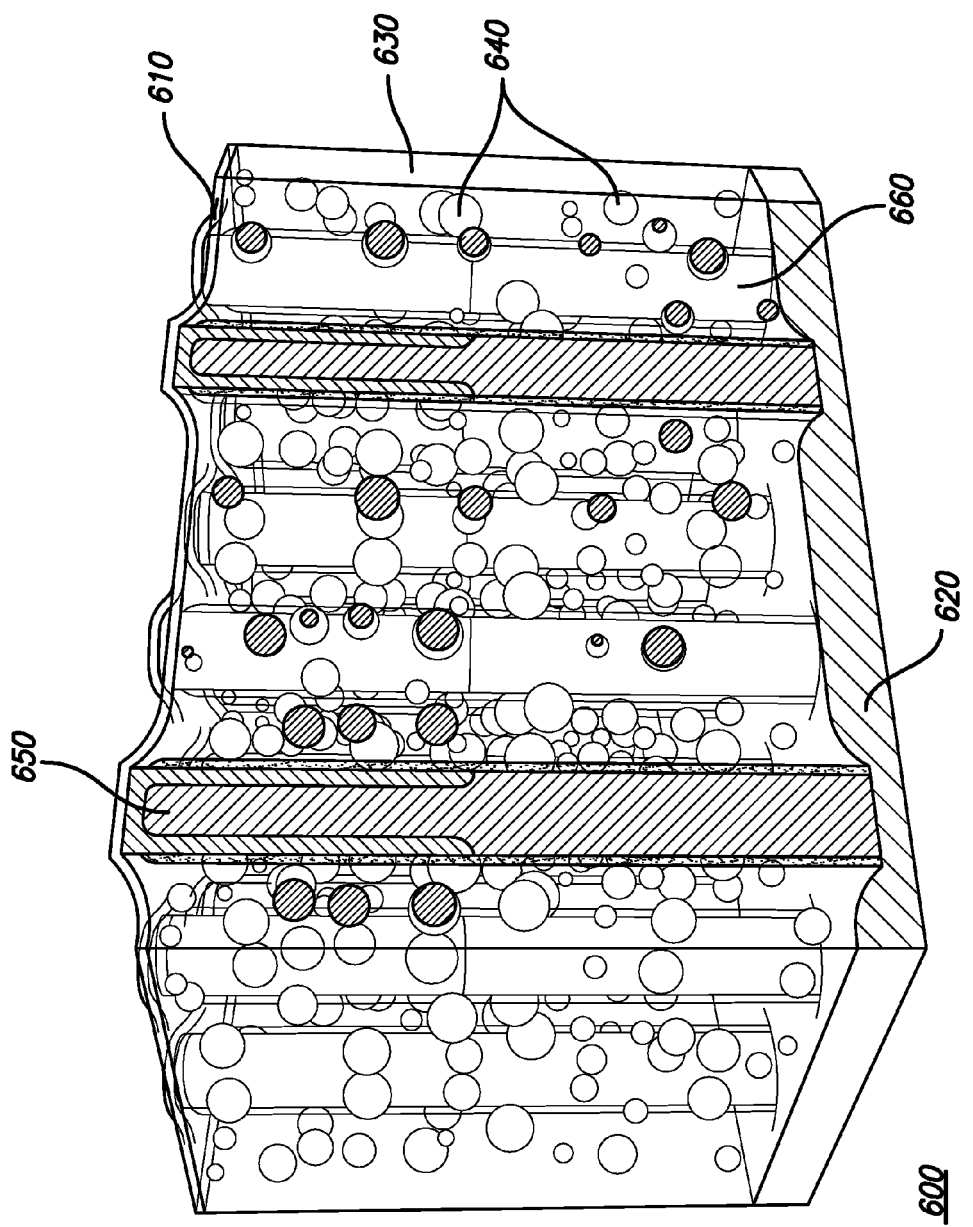
FIG. 13 shows a perspective view of a solar cell according to a further embodiment of the present disclosure.
Figure 14:
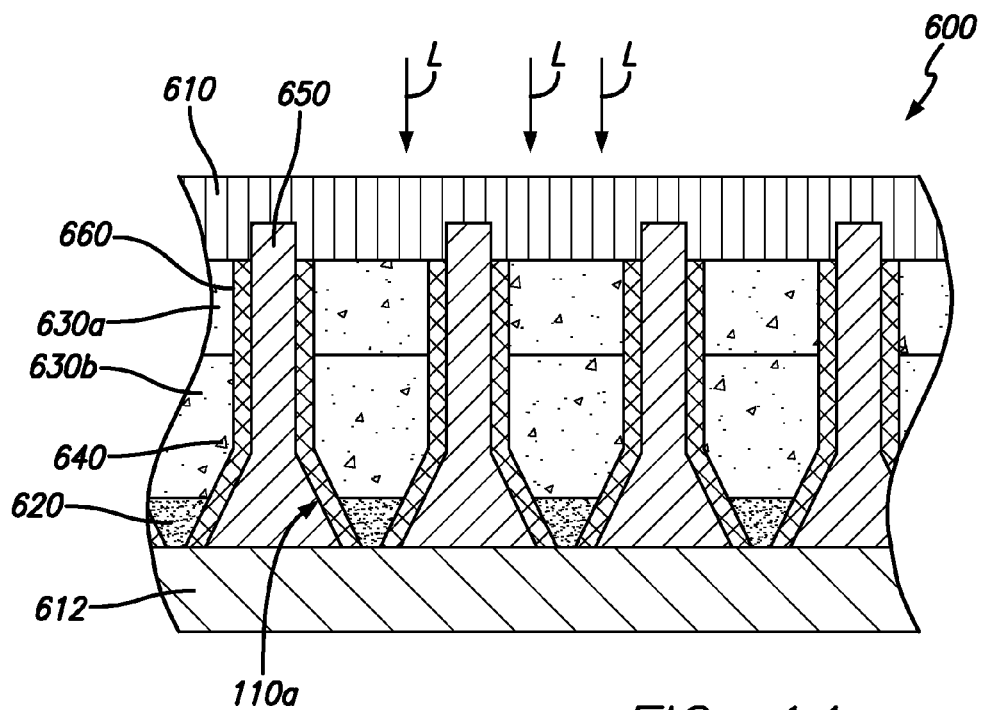
FIG. 14 shows a schematic partial cross sectional view of a solar cell according to a further embodiment of the present disclosure.

FIGS. 13 and 14 of the present application describe embodiments relating to the applications, for example, of the structures (101), (102), (103), (104), (105), (106), (107), (108), (109), (1001), (1002), (1003), (1004), (1005), (1006), (1007), (1008), (1009) and (1010) or any combination of such structures, to semiconductor wire-array photovoltaics and photoconverters, i.e. devices that convert light into electricity, including solar cells, photoelectrochemical cells, photodiodes, phototransistors, and other photosensitive wire-array electronic devices. Such semiconductor wire-array photovoltaics and photoconverters can indifferently be based on any one of the structures (102), (103), (104, (105), (106), (108), (109), (1001), (1002), (1003), (1004), (1005), (1006), (1007), (1008), (1009) and (1010) or any combination of such structures.

As already mentioned in the introductory paragraph of the present application, the present application is also related to U.S. patent application Ser. No. 12/956,422 for "Three-dimensional patterning methods and related devices" filed on even date herewith, incorporated herein by reference in its entirety, and claiming priority to the same US provisional applications of the present application. Such as U.S. patent application Ser. No. 61/265,297 which describes selective p-n junction fabrication for semiconductor microstructures, and related methods and devices.

In particular, shown in FIG. 13 is a perspective view of a Si wire array solar cell (600) with a transparent top contact (610) (e.g. an indium tin oxide (ITO) contact) and a metallic bottom contact (620) acting as a back reflector. Solar cell (600) is embedded into a polymer encasing or environment (630), e.g. a flexible transparent polymer such as PDMS. Light scattering particles (640) (e.g., $Al_2O_3$ particles as described before) are embedded inside the infill or environment (630), so as to surround and circle the Si wires (101). The solar cell (600) further comprises an array of mechanically flexible vertically aligned wires (650). The wires (650) are coated with a surface passivation antireflective coating (660).

The device of FIG. 14 differs from the device of FIG. 13 for the wires which remain on a rigid growth substrate (612) and for which the back reflector (620) is placed between the wires on top of said growth substrate rather than forming a continuous film beneath the infill and semiconductor structures. Furthermore, the bases or bottom of the semiconductor structures, shown in FIG. 14, exhibit feedhorn-like structures as described above and therefore includes a flared portion (110a). Moreover, the device of FIG. 14 includes light scattering material (640) having a light scattering material concentration higher in a bottom zone (630b) of the infill material than in a top zone (630a) of the infill material. In the present embodiment the back reflector (620) is the metal layer and the substrate (612) functions as the contact. Three different types of Si microwire solar cells were fabricated. The "As-Grown" cell contained no light trapping elements or antireflective coating on the semiconductor surfaces. The "Scatterer" cell incorporated light-scattering $Al_2O_3$ particles (nominally 80 nm in diameter) in-between the wires. In a particular embodiment, $Al_2O_3$ particles were hydrophobized via surface functionalization (>1 hr in 10 µl/ml trimethylcholorosilane in $CH_2Cl_2$). The "PRS" cell utilized an a-$SiN_x$:H passivation layer to minimize surface recombination and to serve as an anti-reflection coating, a Ag back reflector to prevent the loss of incident illumination into the growth substrate, and $Al_2O_3$ particles to scatter light incident between the Si microwires. Following the inclusion of the selected light-trapping elements, each wire array was filled to the tips of the wires with mounting wax (a transparent, non-conducting, thermoplastic polymer). Indium tin oxide (ITO) (120-150 nm thick) was then sputtered through a shadow mask to form a top-contact pad and to define individual cells. For both the Scatterer and PRS solar cells, the 80 nm $Al_2O_3$ particles were observed to form micron-sized agglomerates that were located near the base of the wires, permitting the infill region to be conceptually divided into an upper and lower region, for which the density of $Al_2O_3$ particles was significantly lower within the lower infill region. In the PRS solar cells, the 1000 nm thick Ag back reflector covered the growth substrate and the tapered base of the wires.

Under simulated AM 1.5G illumination, the champion PRS solar cell exhibited markedly higher photovoltaic performance than the champion Scatterer and As-Grown solar cells, as a result of a significant increase in short-circuit current density ($J_{SC}$) brought about by the combination of light-trapping elements exemplifying embodiments of the present disclosure. The champion PRS solar cell produced an open-circuit voltage ($V_{OC}$) of 498 mV, $J_{SC}$ of 24.3 mA/cm$^2$, and a fill factor (FF) of 65.4%, for an efficiency of 7.92%. The champion Scatterer and As-Grown solar cells exhibited efficiencies of 5.64% and 3.81%, respectively, with similar $V_{OC}$ and FF but lower $J_{SC}$: 16.6 mA/cm$^2$ and 11.8 mA/cm$^2$, respectively. The improved efficiencies of the Scatter and PRS cells over the As-Grown cells exemplify the benefits to photovoltaic performance afforded by the light-trapping structures of the present disclosure.

A device, such as the one of FIG. 13 or FIG. 14, includes one or more conductive layers, wherein at least some portion of each conductive layer is in contact with one or more of the semiconductor structures or wires (650), whose conductivity provides a path for current collection from the photovoltaic device. The device further includes one or more of the following features: a reflective structure, such as the back reflector (115, 620), an antireflective structure, such as the coating (118, 660), a light-scattering structure, such as the light scattering particles (123, 640), or a light-concentrating structure, such material (116). Additional reflective, antireflective, light-scattering, or light-concentrating structures are applied above or below the conductive layers.

Moreover, according to further embodiments, in such device (600) at least 80% of the carriers excited by the absorption of light within the semiconductor material are collected as current from the photovoltaic device. Additionally, conductive layers can be located above and below the array of elongated semiconductor structures. Moreover, the semiconductor material occupies less than 10% of the volume of the structure enclosed between the two conductive layers.

According to further embodiments, the conductive layer comprises one or more of Ag, In, Al. Each conductive layer can be either at least 90% transparent or at least 90% reflective at a visible wavelength of light. According to further embodiments, some or all of the infill material comprises a conductive layer for the photovoltaic device. According to further embodiments, the antireflective coating or infill material serves to passivate some or all of the surfaces of the semiconductor structures. Some or all of the surfaces of the semiconductor structures are coated by one or more additional layers to provide passivation of the semiconductor surfaces or to increase the conductivity of the photovoltaic device. Moreover, the reflective material may also serve as a conductive layer.

According to a further embodiment, the present disclosure includes a photoelectrochemical device comprising, for example, any one of the structures (101), (102), (103), (104), (105), (106), (107), (108), (109), (1001), (1002), (1003), (1004), (1005), (1006), (1007), (1008), (1009) and (1010) or any combination of such structures. In particular, as mentioned above, FIG. 15 shows a device (700) including an array of wires (110) and a liquid electrolyte solution (1114). The liquid electrolyte solution (114) can include any one of the liquid substances used as infill material, for example, in the structures (101), (102), (103), (104), (105), (106), (107), (108), (109), (1001), (1002), (1003), (1004), (1005), (1006), (1007), (1008), (1009) and (1010) disclosed in the previous paragraphs.

The examples set forth above are provided to give those of ordinary skill in the art a complete disclosure and description of how to make and use the embodiments of the disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

LIST OF CITED REFERENCES

[1] Kayes, B. M., Atwater, H. A. & Lewis, N. S. Comparison of the device physics principles of planar and radial p-n junction nanorod solar cells. J. Appl. Phys. 97, 114302-114311 (2005)

[2] Kelzenberg, M. D. et al. Predicted efficiency of Si wire array solar cells. 34th IEEE Photovoltaic Specialists Conference 1-6 (2009).

[3] Kayes, B. M. et al. Growth of vertically aligned Si wire arrays over large areas (>1 cm2) with Au and Cu catalysts. Appl. Phys. Lett. 91, 103110-103113 (2007).

[4] Marion, B. et al. Validation of a photovoltaic module energy ratings procedure at NREL. Report No. NREL/TP-520-26909, (1999).

[5] Aspnes, D. E. in Properties of crystalline silicon (ed Robert Hull) 677 (INSPEC, IEE, 1999).

[6] Tiedje, T., Yablonovitch, E., Cody, G. D. & Brooks, B. G. Limiting efficiency of silicon solar-cells. IEEE Trans. Electron Devices 31, 711-716 (1984).

[7] Yablonovitch, E. Statistical ray optics. J. Opt. Soc. Am. 72, 899-907 (1982).

[8] Kelzenberg, M. D., Putnam, M. C., Turner-Evans, D. B., Lewis, N. S. & Atwater, H. A. Predicted efficiency of Si wire array solar cells. 34th IEEE Photovoltaic Specialists Conference 1-6 (2009).

[9] Altermatt, P. P., Yang, Y., Langer, T., Schenk, A. & Brendel, R. Simulation of Optical Properties of Si Wire Cells. Photovoltaic Specialists Conference, 2009. PVSC '09. 34th IEEE 1-6.

The invention claimed is:

1. A substrate;

A tiled array of micron sized elongated semiconductor elements extending from the substrate and having a space between each elongated semiconductor element, wherein the semiconductor elements have diameters of at least 1 micron and an aspect ratio greater than 1;

An infill material comprising polydimethylsiloxane located in the space between the elongated semiconductor elements; and A plurality of light scattering elements comprising voids, bubbles, dielectric particles, or metal particles included in the infill material and surrounding the elongated semiconductor elements, wherein the concentration of light scattering elements is higher in proximity to the elongated semiconductor elements, increasing the probability of absorption into the elongated semiconductor elements or wherein the infill material includes an infill bottom zone closed to the bottom of the structure than to an infill top zone, and the concentration of light scattering elements is higher in the infill bottom zone than in the infill top zone, the bottom of the structure being opposite to a zone exposed to incident light, such that light that is reflected or scattered upwards has more distance with which to interact with the wires;

Wherein the array is tiled according to an ordered lattice pattern.

2. The structure of claim 1, wherein the light scattering material uniformly surrounds all sides of the elongated semiconductor elements.

3. The structure of claim 2, wherein the infill material includes an infill bottom zone closer to a bottom of the structure than to a infill top zone, and wherein the concentration of the light scattering material is higher in the infill bottom zone than in the infill top zone, the bottom of the structure being opposite to a zone exposed to incident light.

4. The structure of claim 2, wherein the dielectric composition comprises one element selected from the group including $Al_2O_3$, $BaSO_4$, $TiO_2$, $SiO_2$.

5. The structure of claim 2, wherein the particle of metal comprises one element selected from the group including Ag, Au, Ni, Al and Cu.

6. The structure of claim 3, wherein the elongated semiconductor elements are at least 20 microns in length and have an aspect ratio of at least 5:1.

7. The structure of claim 3, wherein the array of elongated semiconductor elements has a packing fraction less than 5%.

8. A solar cell comprising the structure of claim 2.

9. A photoconverter device, comprising: a top transparent contact, a bottom metal contact, and the structure of claim 2 interposed between the top transparent contact and the bottom metal contact.

* * * * *

UNITED STATES PATENT AND TRADEMARK OFFICE
CERTIFICATE OF CORRECTION

| | | |
|---|---|---|
| PATENT NO. | : 8,808,933 B2 | Page 1 of 1 |
| APPLICATION NO. | : 12/957065 | |
| DATED | : August 19, 2014 | |
| INVENTOR(S) | : Michael D. Kelzenberg et al. | |

It is certified that error appears in the above-identified patent and that said Letters Patent is hereby corrected as shown below:

In the Specification

In Column 1, line 6, insert the following:

--STATEMENT REGARDING FEDERALLY SPONSORED RESEARCH OR DEVELOPMENT

This invention was made with government support under Grant Numbers FG02-07ER46405 and SC0001293 awarded by US Department of Energy, and Grant Number DMR0520565 awarded by The National Science Foundation. The government has certain rights in the invention.--

Signed and Sealed this
Eleventh Day of November, 2014

Michelle K. Lee
*Deputy Director of the United States Patent and Trademark Office*